(12) United States Patent
Kim et al.

(10) Patent No.: US 9,583,161 B1
(45) Date of Patent: Feb. 28, 2017

(54) REPAIR CIRCUIT, MEMORY APPARATUS USING THE SAME AND OPERATING METHOD THEREOF

(71) Applicant: SK hynix Inc., Icheon-si, Gyeonggi-do (KR)

(72) Inventors: Yong Seop Kim, Icheon-si (KR); Ji Hyae Bae, Icheon-si (KR); Min Chul Shin, Icheon-si (KR); Jun Gi Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/246,614

(22) Filed: Aug. 25, 2016

(30) Foreign Application Priority Data

Feb. 17, 2016 (KR) .................. 10-2016-0018511

(51) Int. Cl.
| | | |
|---|---|---|
| *G11C 17/18* | (2006.01) | |
| *G11C 7/22* | (2006.01) | |
| *G11C 8/08* | (2006.01) | |
| *G11C 8/10* | (2006.01) | |
| *G11C 29/00* | (2006.01) | |
| *G11C 17/16* | (2006.01) | |

(52) U.S. Cl.
CPC .............. *G11C 7/22* (2013.01); *G11C 8/08* (2013.01); *G11C 8/10* (2013.01); *G11C 29/781* (2013.01); *G11C 17/16* (2013.01); *G11C 17/18* (2013.01); *G11C 29/785* (2013.01)

(58) Field of Classification Search
CPC ........ G11C 17/18; G11C 17/16; G11C 29/785
USPC ............................ 365/225.7, 230.06, 230.03
See application file for complete search history.

(56) References Cited

U.S. PATENT DOCUMENTS

2007/0147160 A1* 6/2007 Hanzawa ............. G11C 7/1012
365/230.03

FOREIGN PATENT DOCUMENTS

KR    1020040012349 A    2/2004

* cited by examiner

*Primary Examiner* — Jason Lappas
(74) *Attorney, Agent, or Firm* — William Parker & Associates Ltd.

(57) ABSTRACT

A memory apparatus includes a first memory bank, a second memory bank, a row decoder and repair circuit, and an input/output driver controller. The row decoder and repair circuit is coupled to the first and second memory banks in common. The row decoder and repair circuit generates a shared repair signal according to whether a word line disposed in a first memory bank is replaced with a word line disposed in a second memory bank. The input/output driver controller allows read or write operations for one of the first and second memory banks to be performed based on the shared repair signal and an operation signal.

19 Claims, 8 Drawing Sheets

REPAIR CIRCUIT, MEMORY APPARATUS USING THE SAME AND OPERATING METHOD THEREOF

CROSS-REFERENCES TO RELATED APPLICATION

The present application claims priority under 35 U.S.C. §119(a) to Korean application number 10-2016-0018511, filed on Feb. 17, 2016, in the Korean Intellectual Property Office, which is incorporated herein by reference in its entirety.

BACKGROUND

1. Technical Field

Various embodiments generally relate to a semiconductor apparatus, and, more particularly, to a repair circuit, a memory apparatus using the same and an operating method thereof.

2. Related Art

In general, a memory apparatus may include a plurality of memory banks each of which includes a plurality of memory cell arrays. In each memory bank, a plurality of word lines and a plurality of bit lines may be disposed perpendicular to each other, and memory cells may be coupled at points where the word lines and the bit lines intersect. As the manufacturing process of a memory apparatus is highly integrated, a failure may occur due to a coupling relationship between memory cells or between a memory cell and a word line or a bit line. Therefore, a memory bank includes a redundant array for replacing a memory cell in which a failure occurs.

FIG. 1 is a diagram schematically illustrating a representation of an example configuration of a memory apparatus 10 according to the conventional art. In FIG. 1, the memory apparatus 10 may include a first memory bank MB1, a second memory bank MB2, and a row decoder and repair circuit 11. Each of the first memory bank MB1 and the second memory bank MB2 may include a plurality of word lines WL. Further, each of the first memory bank MB1 and the second memory bank MB2 may include a normal array NA and a redundant array RA. The number of the word lines disposed in the normal array NA may be larger than the number of the word lines disposed in the redundant array RA. The row decoder and repair circuit 11 may be disposed between the first and second memory banks MB1 and MB2, and select any bank of the first and second memory banks MB1 and MB2 and any word line in the selected memory bank, based on an address signal. The row decoder and repair circuit 11 may include a fuse circuit for replacing a failed word line with a redundant word line disposed in the redundant array RA, when a failure occurs in the word line selected based on the address signal.

It is illustrated in FIG. 1 that four word lines are disposed in the redundant array RA of each memory bank. Also, it is illustrated that failures have occurred in five word lines in the normal array NA of the first memory bank MB1 and failures have occurred in three word lines in the normal array NA of the second memory bank MB2. The symbol X appearing on the failed memory cell and/or word line represents a failure that occurred in a memory cell and/or word line. In the second memory bank MB2, the three word lines in which failures have occurred may be replaced with the word lines disposed in the redundant array RA. Therefore, the second memory bank MB2 may operate normally. However, in the first memory bank MB1, because the number of failed word lines is larger than the number of the word lines disposed in the redundant array RA, one among the five failed word lines may not be replaced. Accordingly, the failure of the one word line may not be repaired. Due to this fact, the first memory bank MB1 may not operate normally, and as a result, the entire memory apparatus 10 cannot help but be sorted out as a bad product.

SUMMARY

In an embodiment, a memory apparatus may include: a row decoder and repair circuit configured to generate a shared repair signal according to whether a word line disposed in a first memory bank is replaced with a word line disposed in a second memory bank; a first input/output driver configured to transmit and receive data between the first memory bank and data transmission lines based on a first enable signal; a second input/output driver configured to transmit and receive data between the second memory bank and the data transmission lines based on a second enable signal; and an input/output driver controller configured to generate the first and second enable signals based on the shared repair signal and an operation signal.

In an embodiment, a memory apparatus may include: a row decoder and repair circuit configured to generate a shared repair signal according to whether a word line disposed in a normal array of a first memory bank is replaced with a word line disposed in a redundant array of a second memory bank; a first input/output driver configured to output data from the first memory bank to data input/output lines, or provide data transmitted through the data input/output lines to the first memory bank, based on a first enable signal; a second input/output driver configured to output data from the second memory bank to the data input/output lines, or provide data transmitted through the data input/output lines to the second memory bank, based on a second enable signal; and an input/output driver controller configured to generate the first and second enable signals based on the shared repair signal and an operation signal.

In an embodiment, a method for operating a memory apparatus including first and second memory banks which are disposed adjacent to each other may include: activating simultaneously the first and second memory banks based on a row address signal; determining a level of a shared repair signal; and performing a read or write operation for one of the first memory bank and the second memory bank based on the shared repair signal and an operation signal.

DETAILED DESCRIPTION

Hereinafter, a repair circuit, a memory apparatus using the same and an operating method thereof will be described below with reference to the accompanying drawings through various example embodiments.

Embodiments may provide a repair circuit which controls a redundant array which is shared between adjacent memory banks, a memory apparatus using the same, and an operating method thereof.

Figure 1:
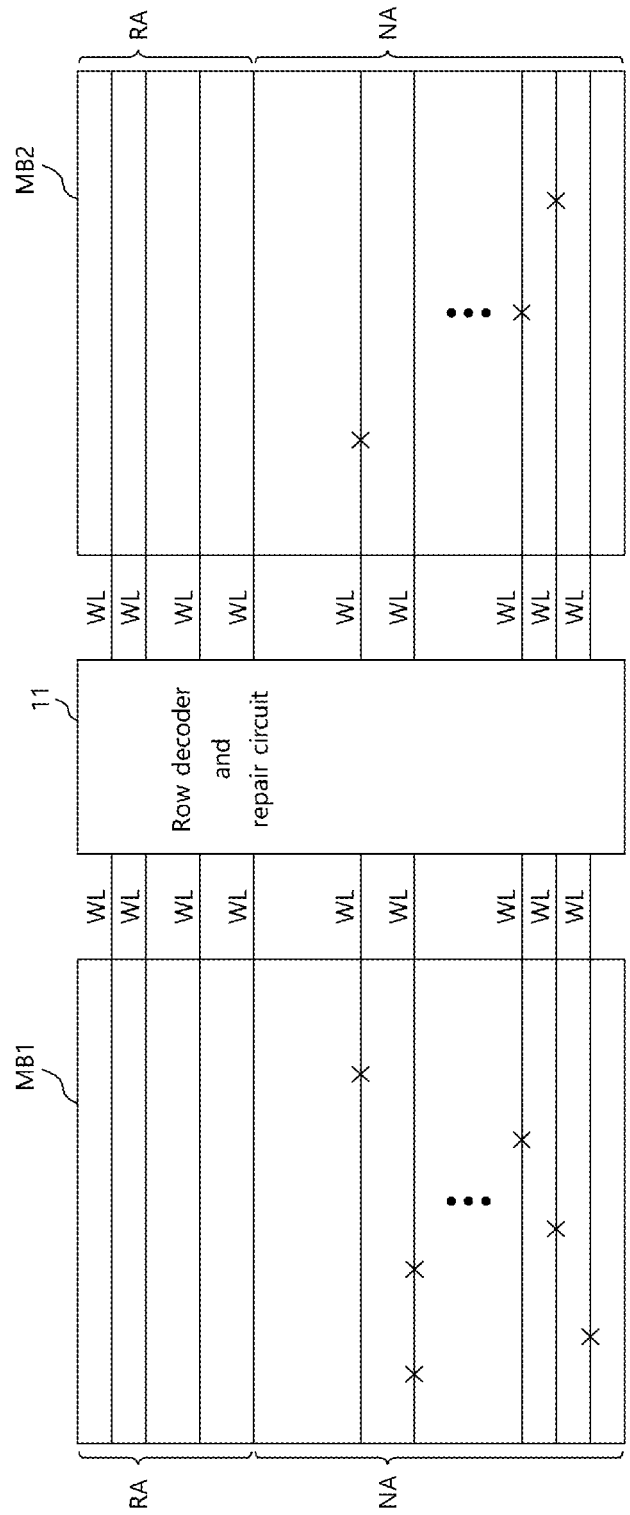
FIG. 1 is a diagram schematically illustrating a representation of an example of the configuration of a memory apparatus according to the conventional art.
Figure 2:
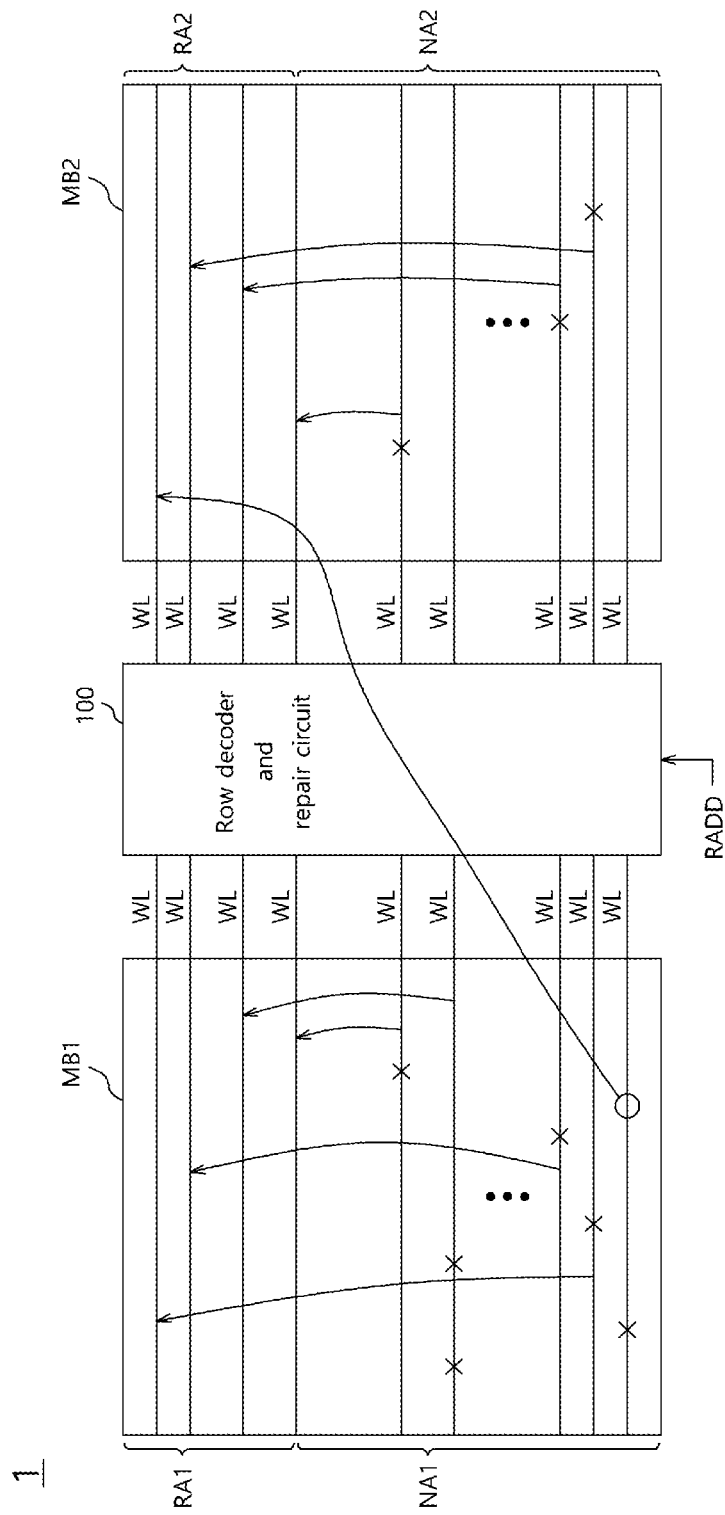
FIG. 2 is a diagram illustrating a representation of an example configuration and an operating principle of a memory apparatus in accordance with an embodiment of the present disclosure.

FIG. 2 is a diagram illustrating a representation of an example configuration and an operating principle of a memory apparatus in accordance with an embodiment. In FIG. 2, the memory apparatus 1 may include a first memory bank MB1, a second memory bank MB2, and a row decoder and repair circuit 100. The first and second memory banks MB1 and MB2 may be disposed adjacent to each other. Each of the first and second memory banks MB1 and MB2 may include a plurality of memory cell arrays. Each of the first and second memory banks MB1 and MB2 may include a plurality of word lines WL, and, while not shown, may include a plurality of bit lines which are disposed to intersect the plurality of word lines WL. Memory cells may be coupled at points where the word lines WL and the bit lines intersect each other. The first memory bank MB1 may include a normal array NA1 and a redundant array RA1. A plurality of word lines WL may be disposed in each of the normal array NA1 and the redundant array RA1. The number of the word lines WL disposed in the normal array NA1 may be larger than the number of the word lines WL disposed in the redundant array RA1. Similar to the first memory bank MB1, the second memory bank MB2 may include a normal array NA2 and a redundant array RA2, and each of the normal array NA2 and the redundant array RA2 may include a plurality of word lines WL.

In the present embodiment, a failed word line among the word lines WL disposed in the first memory bank MB1 may be replaced with a word line disposed in the second memory bank MB2, and a failed word line among the word lines WL disposed in the second memory bank MB2 may be replaced with a word line disposed in the first memory bank MB1. A word line WL from the redundant array RA1 of the first memory bank MB1 may replace a failed word line among the word lines WL disposed in the normal arrays NA1 and NA2 of the first and second memory banks MB1 and MB2. Similarly, a word line WL from the redundant array RA2 of the second memory bank MB2 may replace a failed word line among the word lines WL disposed in the normal arrays NA1 and NA2 of the first and second memory banks MB1 and MB2. That is to say, the respective first and second redundant arrays RA1 and RA2 may be shared by the first and second memory banks MB1 and MB2.

The row decoder and repair circuit 100 may receive an address signal RADD. The address signal RADD may include a row address signal, a bank address signal, and so forth. The row decoder and repair circuit 100 may be shared by the first and second memory banks MB1 and MB2. The row decoder and repair circuit 100 may select at least one among the word lines WL disposed in the first and second memory banks MB1 and MB2, based on the address signal RADD. The row decoder and repair circuit 100 may select a specified word line WL for reading or writing data, based on the address signal RADD. In the case where the word line WL selected by the address signal RADD is a failed word line, the row decoder and repair circuit 100 may perform a repair operation such that a word line WL disposed in the redundant arrays RA1 and RA2 is selected in place of the failed word line. For example, the row decoder and repair circuit 100 may include a plurality of fuse circuits. The plurality of fuse circuits may include row repair fuses associated with the first memory bank MB1 and row repair fuses associated with the second memory bank MB2. The row repair fuses may be cut according to whether a failure has occurred in the word lines WL disposed in the normal arrays NA1 and NA2, and the failed word line may be replaced with a word line disposed in the redundant arrays RA1 and RA2.

When the number of failed word lines among the word lines WL of the normal array NA1 of the first memory bank MB1 exceeds the number of the word lines WL disposed in the redundant array RA1 of the first memory bank MB1, the row decoder and repair circuit 100 may replace a number of excessive failed word lines with the word lines disposed in the redundant array RA2 of the second memory bank MB2. Conversely, when the number of failed word lines among the word lines WL of the normal array NA2 of the second memory bank MB2 exceeds the number of the word lines WL disposed in the redundant array RA2 of the second memory bank MB2, the row decoder and repair circuit 100 may replace a number of excessive failed word lines with the word lines disposed in the redundant array RA1 of the first memory bank MB1.

In FIG. 2, it is illustrated that each of the redundant arrays RA1 and RA2 of the first and second memory banks MB1 and MB2 includes four word lines WL. However, it is to be noted that the number of word lines included in each of the redundant arrays RA1 and RA2 is not specifically limited. It is assumed that failures have occurred in five word lines among the word lines WL disposed in the normal array NA1 of the first memory bank MB1 and failures have occurred in three word lines among the word lines WL disposed in the normal array NA2 of the second memory bank MB2. Memory cells and/or Word lines having failures are indicated by the symbol X. The row decoder and repair circuit 100 may replace four word lines among the word lines failed in the normal array NA1 of the first memory bank MB1, with the word lines disposed in the redundant array RA1 of the first memory bank MB1. Further, the row decoder and repair circuit 100 may replace three word lines among the word lines failed in the normal array NA2 of the second memory bank MB2, with the word lines disposed in the redundant array RA2 of the second memory bank MB2. Resultantly, one failed word line which is not replaced yet may remain in the first memory bank MB1, and one word line which is able to replace a failed word line may remain in the second memory bank MB2. The row decoder and repair circuit 100 may replace the remaining one failed word line of the first memory bank MB1 with the word line remaining in the redundant array RA2 of the second memory bank MB2. Accordingly, repair operations for all the failed word lines disposed in the first memory bank MB1 and the second memory bank MB2 may be completed, and both the first and second memory banks MB1 and MB2 may operate normally.

Figure 3:
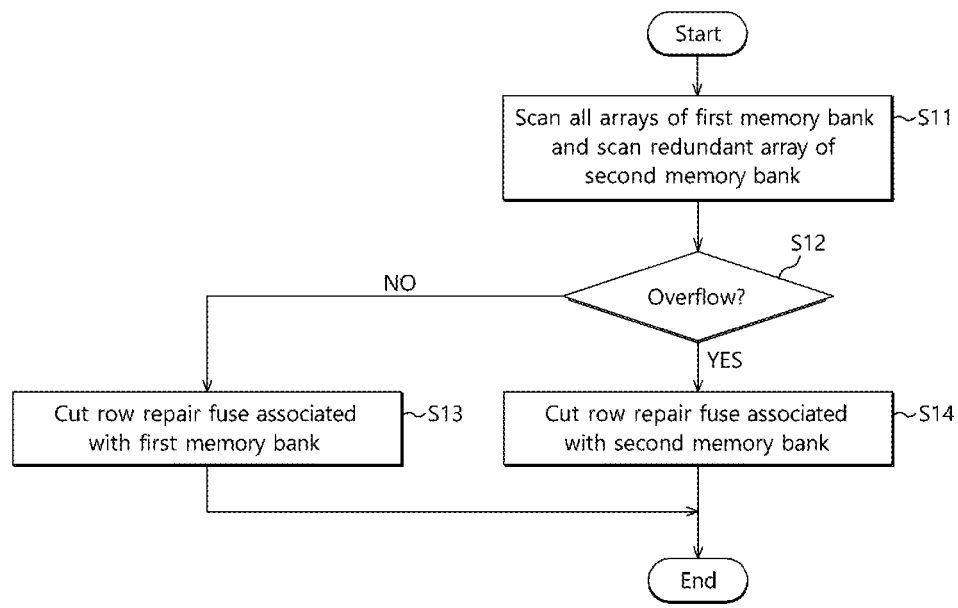
FIG. 3 is a representation of an example flow chart to assist in an explanation of a row repair operation of the memory apparatus shown in FIG. 2.

FIG. 3 is a representation of an example flow chart to assist in an explanation of a row repair operation of the memory apparatus shown in FIG. 2. If a row repair operation is started, the row decoder and repair circuit 100 may scan all the arrays of the first memory bank MB1, that is, the normal array NA1 and the redundant array RA1, and the row decoder and repair circuit 100 may scan the redundant array RA2 of the second memory bank MB2 (S11). By scanning all the arrays of the first memory bank MB1, the row decoder and repair circuit 100 may determine whether a failed word line which needs to be repaired exists and whether a word line which is able to replace a failed word line exists. Also, by scanning the redundant array RA2 of the second memory bank MB2, the row decoder and repair circuit 100 may determine whether a word line which is able to replace a failed word line exists.

Thereafter, the row decoder and repair circuit 100 may determine whether an overflow has occurred (S12). The overflow may be information on whether the number of the failed word lines that occurred in one memory bank exceeded the number of the word lines disposed in the redundant array of the one memory bank. When a failed word line is scanned in the normal array NA1 of the first memory bank MB1 and a word line which is able to replace the failed word line exists in the redundant array RA1 of the first memory bank MB1, the row decoder and repair circuit 100 may determine that an overflow has not occurred. When a failed word line is scanned in the normal array NA1 of the first memory bank MB1 and all the word lines of the redundant array RA1 of the first memory bank MB1 are currently being used, the row decoder and repair circuit 100 may determine that an overflow has occurred.

If an overflow has not occurred, the row decoder and repair circuit 100 may cut a row repair fuse associated with the first memory bank MB1, and replace a failed word line with a word line disposed in the redundant array RA1 of the first memory bank MB1 (S13). If an overflow has occurred, the row decoder and repair circuit 100 may cut a row repair fuse associated with the second memory bank MB2, and replace a failed word line with a word line disposed in the redundant array RA2 of the second memory bank MB2 (S14).

Figure 4:
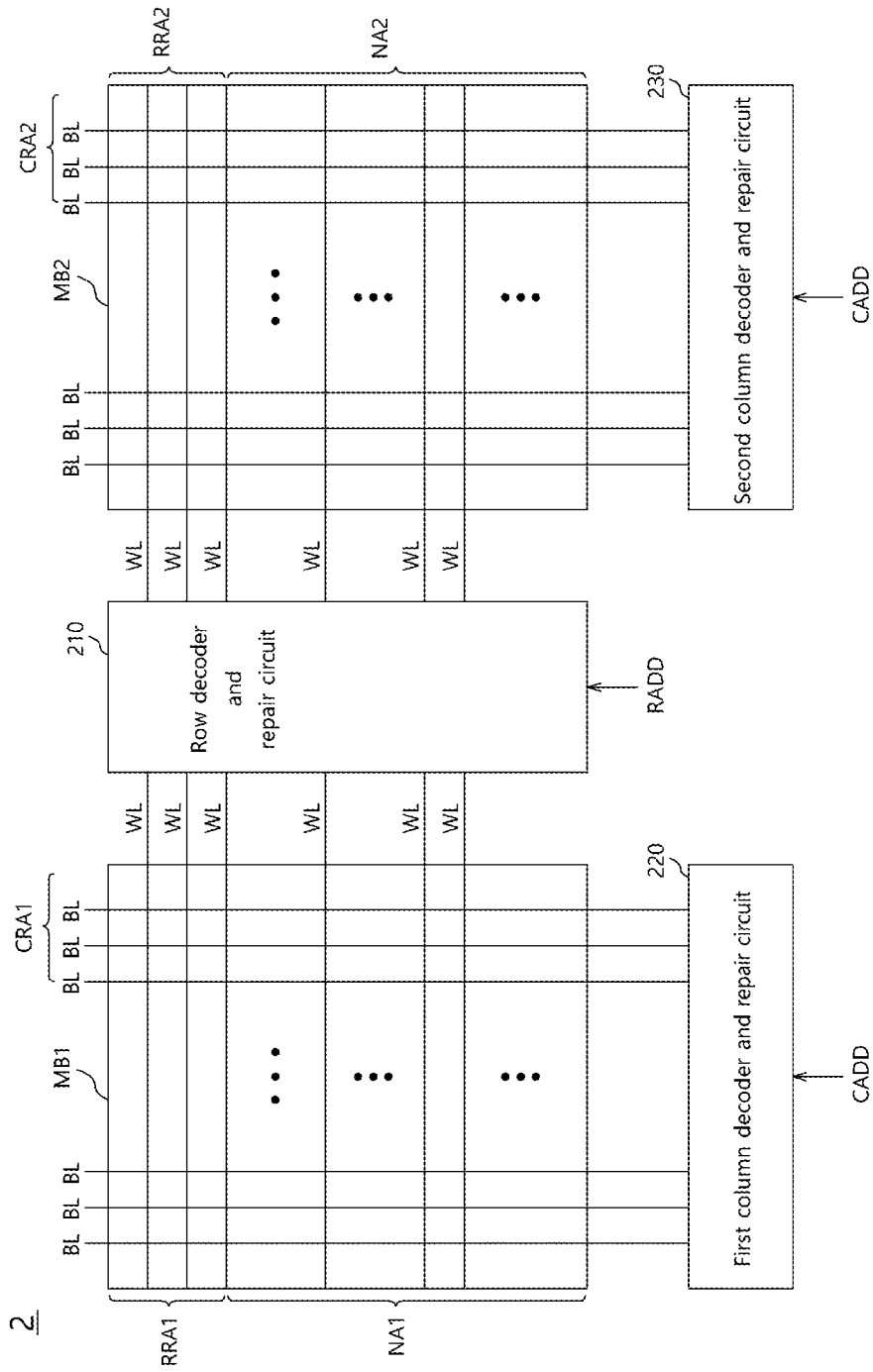
FIG. 4 is a diagram illustrating a representation of an example configuration of a memory apparatus in accordance with an embodiment of the present disclosure.

FIG. 4 is a diagram illustrating a representation of an example configuration of a memory apparatus 2 in accordance with an embodiment. In FIG. 4, the memory apparatus 2 may include a first memory bank MB1, a second memory bank MB2, a row decoder and repair circuit 210, a first column decoder and repair circuit 220, and a second column decoder and repair circuit 230. The first memory bank MB1 may include a plurality of word lines WL and a plurality of bit lines BL, and may be divided into a normal array NA1, a row redundant array RRA1, and a column redundant array CRA1. The second memory bank MB2 may include a plurality of word lines WL and a plurality of bit lines BL, and may be divided into a normal array NA2, a row redundant array RRA2, and a column redundant array CRA2. When a failure occurs in a word line WL disposed in either of the normal arrays NA1 or NA2 of the first and second memory banks MB1 and MB2, the row redundant array RRA1 of the first memory bank MB1 may replace the failed word line WL. Alternatively, when a failure occurs in a bit line BL disposed in either of the normal arrays NA1 or NA2 of the first and second memory banks MB1 and MB2, the column redundant array CRA1 of the first memory bank MB1 may replace the failed bit line BL. Similarly, when a failure occurs in a word line WL disposed in either of the normal arrays NA1 or NA2 of the first and second memory banks MB1 and MB2, the row redundant array RRA2 of the second memory bank MB2 may replace the failed word line WL. Alternatively, when a failure occurs in a bit line BL disposed in either of the normal arrays NA1 or NA2 of the first and second memory banks MB1 and MB2, the column redundant array CRA2 of the second memory bank MB2 may replace the failed bit line BL.

The row decoder and repair circuit 210 may receive a row address signal RADD, and may have substantially the same configuration and perform substantially the same function as the row decoder and repair circuit 100 shown in FIG. 2. The first column decoder and repair circuit 220 may receive a column address signal CADD, and select a specified bit line among the bit lines BL disposed in the normal array NA1 of the first memory bank MB1. The first column decoder and repair circuit 220 may repair a failed bit line among the bit lines BL disposed in the normal array NA1, with a bit line BL disposed in the column redundant array CRA1 of the first memory bank MB1 or the column redundant array CRA2 of the second memory bank MB2. The first column decoder and repair circuit 220 may include a plurality of fuse circuits for repair operations, and the plurality of fuse circuits may include a plurality of column repair fuses associated with the first memory bank MB1.

The second column decoder and repair circuit 230 may receive a column address signal CADD, and select a specified bit line among the bit lines BL disposed in the normal array NA2 of the second memory bank MB2. The second column decoder and repair circuit 230 may repair a failed bit line among the bit lines BL disposed in the normal array NA2, with a bit line BL disposed in the column redundant array CRA1 of the first memory bank MB1 or the column redundant array CRA2 of the second memory bank MB2. The second column decoder and repair circuit 230 may include a plurality of fuse circuits for repair operations, and the plurality of fuse circuits may include a plurality of column repair fuses associated with the second memory bank MB2.

Figure 5:
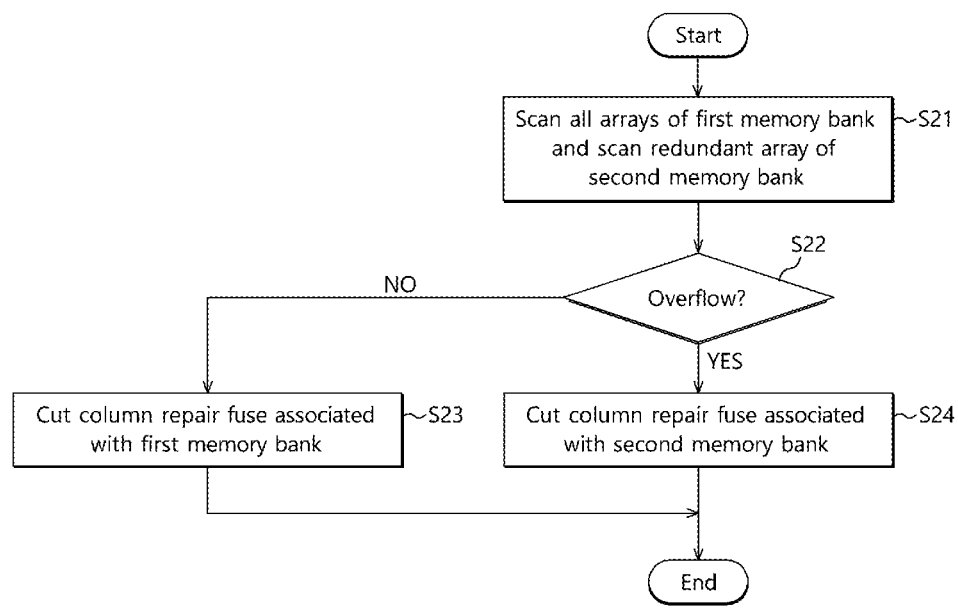
FIG. 5 is a representation of an example flow chart to assist in an explanation of a column repair operation of the memory apparatus shown in FIG. 4.

FIG. 5 is a representation of an example flow chart to assist in an explanation of a column repair operation of the memory apparatus shown in FIG. 4. In FIG. 5, if a column repair operation is started, the first and second column decoders and repair circuits 220 and 230 may scan all the arrays of the first memory bank MB1, that is, the normal array NA1 and the column redundant array CRA1, and scan the column redundant array CRA2 of the second memory bank MB2 (S21). By scanning all the arrays of the first memory bank MB1, the first column decoder and repair circuit 220 may scan whether a failed bit line which needs to be repaired exists and whether a bit line which is able to replace a failed bit line exists. Also, by scanning the column redundant array CRA2 of the second memory bank MB2, the second column decoder and repair circuit 230 may scan whether a bit line which is able to replace a failed bit line exists.

Thereafter, the first column decoder and repair circuit 220 may determine whether an overflow has occurred (S22). An overflow may be information on whether the number of the failed bit lines which occurred in one memory bank exceeds the number of the bit lines disposed in the column redundant array of the one memory bank. When one or more failed bit lines are scanned in the first memory bank MB1 and bit lines able to replace the one or more failed bit lines exists in the column redundant array CRA1 of the first memory bank MB1, the first column decoder and repair circuit 220 may determine that an overflow has not occurred. When one or more failed bit lines are scanned in the first memory bank MB1 but bit lines which able to replace the failed one or more bit lines do not exist in the column redundant array CRA1 of the first memory bank MB1, the first column decoder and repair circuit 220 may determine that an overflow has occurred.

If an overflow has not occurred, a column repair fuse of the first column decoder and repair circuit 220 may be cut, and a failed bit line may be replaced with a bit line disposed in the column redundant array CRA1 of the first memory bank MB1 (S23). If an overflow has occurred, a column repair fuse of the second column decoder and repair circuit 230 may be cut, and a failed bit line may be replaced with a bit line disposed in the column redundant array CRA2 of the second memory bank MB2 (S24). At this time, because a failed bit line is replaced with a bit line disposed in the column redundant array CRA2 of the second memory bank MB2, information is gathered on a word line that should be repaired with the failed bit line. Therefore, a row repair fuse associated with an optional word line coupled with a bit line disposed in the column redundant array CRA2 of the second memory bank MB2 which replaces a failed bit line, should be cut together.

Figure 6:
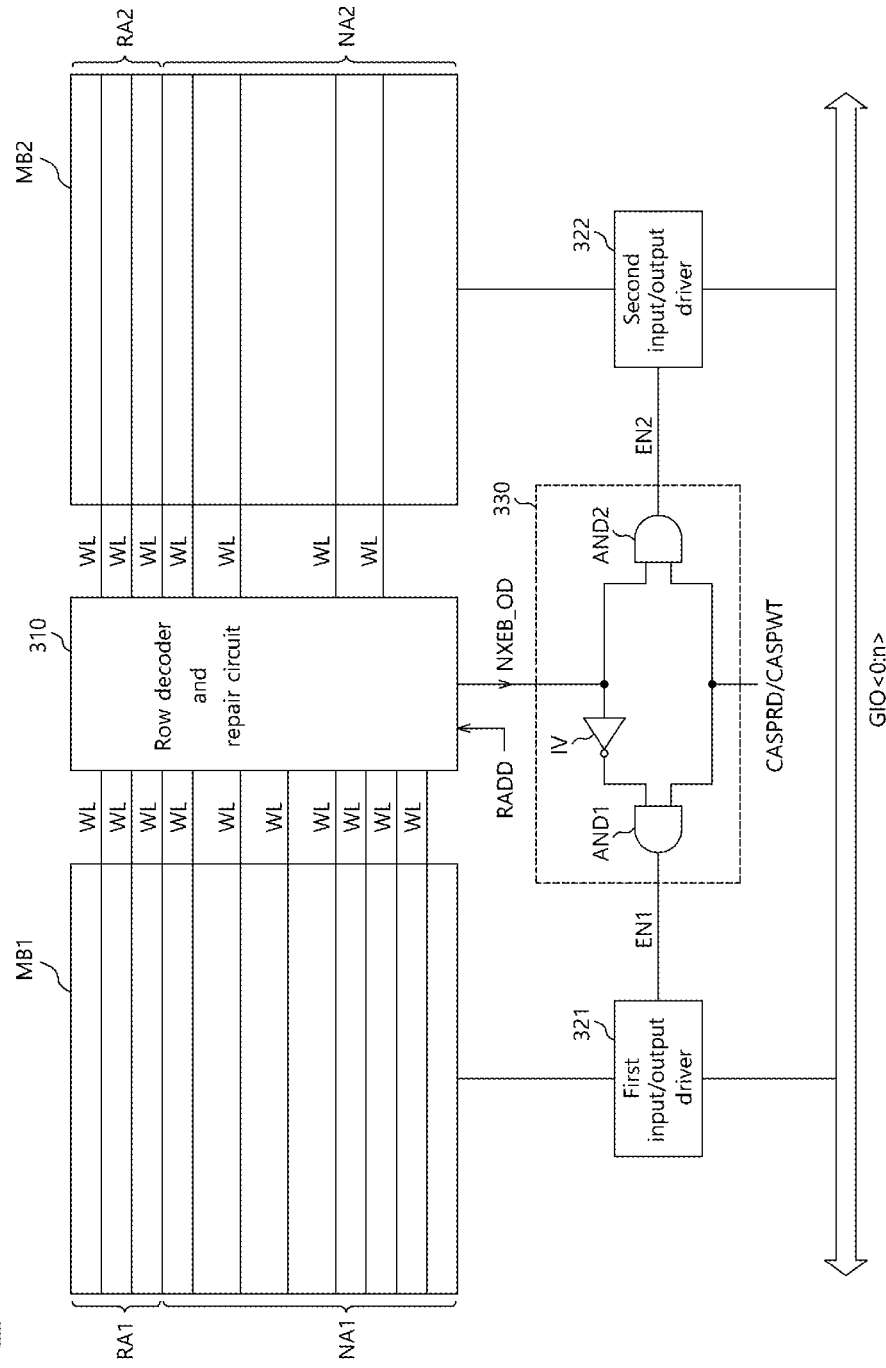
FIG. 6 is a diagram illustrating a representation of an example configuration of a memory apparatus in accordance with an embodiment of the present disclosure.

FIG. 6 is a diagram illustrating a representation of an example configuration of a memory apparatus 3 in accordance with an embodiment. FIG. 6 illustrates a configuration of a memory apparatus 3 for normally performing an operation when a failure which occurred in one memory bank is repaired in another memory bank. The memory apparatus 3 may include a first memory bank MB1, a second memory bank MB2, a row decoder and repair circuit 310, a first input/output driver 321, a second input/output driver 322, and an input/output driver controller 330. The first memory bank MB1 may include a plurality of word lines WL, and may be divided into a normal array NA1 and a redundant array RA1. The second memory bank MB2 may include a plurality of word lines WL, and may be divided into a normal array NA2 and a redundant array RA2.

The row decoder and repair circuit 310 may receive a row address signal RADD, and may have substantially the same configuration and perform substantially the same function as the row decoder and repair circuit 100 shown in FIG. 2. The row decoder and repair circuit 310 may generate a shared repair signal NXEB_OD having a value which depends upon a result of a repair operation. The row decoder and repair circuit 310 may generate the shared repair signal NXEB_OD according to whether a word line disposed in the first memory bank MB1 is replaced with a word line disposed in the second memory bank MB2. More specifically, the row decoder and repair circuit 310 may generate the shared repair signal NXEB_OD according to whether a word line disposed in the normal array NA1 of the first memory bank MB1 is replaced with a word line disposed in the redundant array RA2 of the second memory bank MB2. The row decoder and repair circuit 310 may generate the shared repair signal NXEB_OD which has a first level, when an overflow has not occurred as in FIG. 3, and generate the shared repair signal NXEB_OD which has a second level, when an overflow has occurred. For example, the first level may be a logic low level, and the second level may be a logic high level.

The first input/output driver 321 may couple the first memory bank MB1 and data transmission lines such as, data input/output lines GIO<0:n>. The first input/output driver 321 may drive data input/output lines GIO<0:n> based on the data outputted from the first memory bank MB1 in a read operation. That is to say, the first input/output driver 321 may output the data outputted from the first memory bank MB1 to the data input/output lines GIO<0:n>. The first input/output driver 321 may provide the data transmitted through the data input/output lines GIO<0:n> to the first memory bank MB1 based on a first enable signal EN1, in a write operation.

The second input/output driver 322 may couple the second memory bank MB2 and the data input/output lines GIO<0:n>. The second input/output driver 322 may drive the data input/output lines GIO<0:n> based on data outputted from the second memory bank MB2 in a read operation. That is to say, the second input/output driver 322 may output the data outputted from the second memory bank MB2, to the data input/output lines GIO<0:n>. The second input/output driver 322 may provide the data transmitted through the data input/output lines GIO<0:n> to the second memory bank MB2 based on a second enable signal EN2, in a write operation.

The input/output driver controller 330 may generate the first and second enable signals EN1 and EN2 based on the shared repair signal NXEB_OD and an operation signal. The operation signal may include a read signal CASPRD and/or a write signal CASPWT. The read signal CASPRD may be enabled when the memory apparatus 3 receives a command which commands a read operation to be performed, and the write signal CASPWT may be enabled when the memory apparatus 3 receives a command which commands a write operation to be performed. Further, the memory apparatus 3 may perform a read operation or a write operation for one of the first memory bank MB1 or the second memory bank MB2 based on the shared repair signal NXEB_OD and the operation signal.

The input/output driver controller 330 may enable the first enable signal EN1 when the shared repair signal NXEB_OD has the first level and the read signal CASPRD or the write signal CASPWT is enabled. The input/output driver controller 330 may enable the second enable signal EN2 when the shared repair signal NXEB_OD has the second level and the read signal CASPRD or the write signal CASPWT is enabled.

In FIG. 6, the input/output driver controller 330 may include an inverter IV, a first AND gate AND1, and a second AND gate AND2. The inverter IV may invert the shared repair signal NXEB_OD and output a resultant signal. The first AND gate AND1 may receive the output of the inverter IV as a first input and the read signal CASPRD or the write signal CASPWT as a second input, and the first AND gate AND1 may output the first enable signal EN1. The second AND gate AND2 may receive the shared repair signal NXEB_OD as a first input and the read signal CASPRD or the write signal CASPWT as a second input, and the second AND gate AND2 may output the second enable signal EN2.

Figure 7:
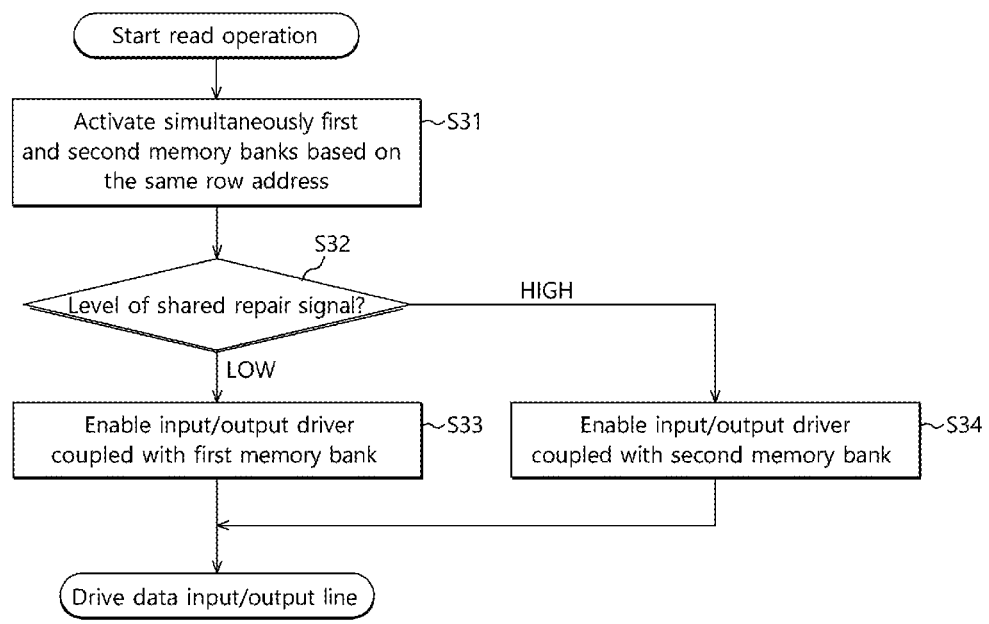
FIG. 7 is a representation of an example flow chart to assist in an explanation of the operation of the memory apparatus shown in FIG. 6.

FIG. 7 is a representation of an example flow chart to assist in an explanation of the operation of the memory apparatus 3 shown in FIG. 6. A method for operating the memory apparatus 3 in accordance with an embodiment will be described below with reference to FIGS. 6 and 7. If a read operation is started, the read signal CASPRD may be enabled to the second level. The row decoder and repair circuit 310 may receive the row address signal RADD to select a memory bank MB1 or MB2 in which a memory cell storing data to be read is included and select a word line WL. The row decoder and repair circuit 310 may simultaneously activate the first and second memory banks MB1 and MB2 based on the row address signal RADD (S31). In other words, the row decoder and repair circuit 310 may select together a specified word line of the first memory bank MB1 corresponding to the row address signal RADD and a specified word line of the second memory bank MB2 corresponding to the row address signal RADD.

The row decoder and repair circuit 310 may generate the shared repair signal NXEB_OD by determining in which memory bank MB1 or MB2 a specified word line corresponding to the row address signal RADD is disposed. For example, when a specified word line corresponding to the row address signal RADD is a failure-free word line which does not need to be repaired, the shared repair signal NXEB_OD may have the first level. Also, when the specified word line is replaced with a word line disposed in the redundant array RA1 of the first memory bank MB1, the shared repair signal NXEB_OD may have the first level. When the specified word line is replaced with a word line disposed in the redundant array RA2 of the second memory bank MB2, the shared repair signal NXEB_OD may have the second level. The input/output driver controller 330 may determine a level of the shared repair signal NXEB_OD (S32).

If the shared repair signal NXEB_OD has the first level and the operation signal is enabled, the input/output driver controller 330 may enable the first enable signal EN1, and thereby enable the first input/output driver 321 which may couple the first memory bank MB1 and the data input/output lines GIO<0:n> (S33). The first input/output driver 321 may be enabled in response to the first enable signal EN1, and drive the data input/output lines GIO<0:n> based on the data outputted from the first memory bank MB1. Conversely, if the shared repair signal NXEB_OD has the second level and the operation signal is enabled, the input/output driver controller 330 may enable the second enable signal EN2, and thereby enable the second input/output driver 322 which couples the second memory bank MB2 and the data input/output lines GIO<0:n> (S34). The second input/output driver 322 may be enabled in response to the second enable signal EN2, and drive the data input/output lines GIO<0:n> based on the data outputted from the second memory bank MB2.

When the first memory bank MB1 includes a failed word line and an overflow occurs, the failed word line is replaced with a word line disposed in the second memory bank MB2, the input/output driver controller 330 may enable the second enable signal EN2 instead of the first enable signal EN1 depending upon the shared repair signal NXEB_OD. Accordingly, even though the read operation is performed for the first memory bank MB1, data may be outputted from the second memory bank MB2 which includes a replacement word line.

While the read operation of the memory apparatus 3 is representatively illustrated in FIG. 7, a write operation may be performed in substantially the same sequence. Further, while it is illustrated that a word line of the first memory bank MB1 is replaced with or repaired by a word line of the second memory bank MB2, an opposite operation may be performed. Furthermore, the concept of the present embodiment may be applied to not only two memory banks but also three or more memory banks through a simple modification or change.

Figure 8:
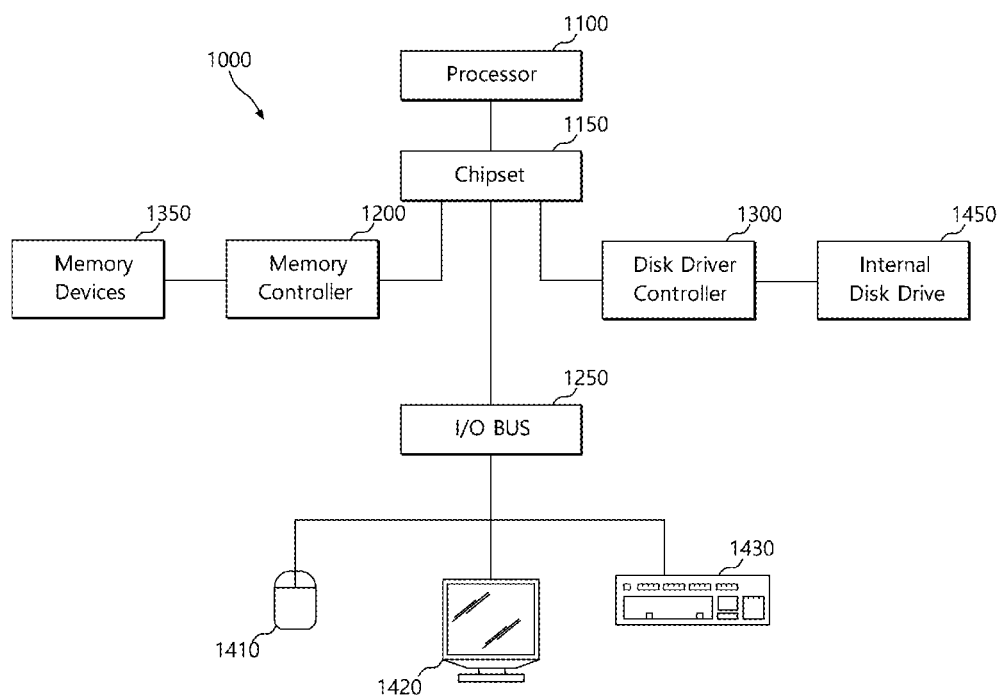
FIG. 8 illustrates a block diagram of an example representation of a system employing a semiconductor device in accordance with the various embodiments discussed above with relation to FIGS. 1-7.

The semiconductor devices and/or a power driving circuits discussed above (see FIGS. 1-7) are particularly useful in the design of memory devices, processors, and computer systems. For example, referring to FIG. 8, a block diagram of a system employing a semiconductor device including a memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one memory apparatus as discussed above with reference to FIGS. 1-7. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one memory apparatus described above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 8 is merely one example of a system 1000 employing a semiconductor device including a memory apparatus as discussed above with relation to FIGS. 1-7. In alternate embodiments, such as, for example but not limited to, cellular phones or digital cameras, the components may differ from the embodiments illustrated in FIG. 8.

While various embodiments have been described above, it will be understood to those skilled in the art that the embodiments described are examples only. Accordingly, the repair circuit, the memory apparatus using the same and the operating method thereof described herein should not be limited based on the described embodiments.

What is claimed is:

1. A memory apparatus comprising:
   a row decoder and repair circuit configured to generate a shared repair signal according to whether a word line disposed in a first memory bank is replaced with a word line disposed in a second memory bank;
   a first input/output driver configured to transmit and receive data between the first memory bank and data transmission lines based on a first enable signal;
   a second input/output driver configured to transmit and receive data between the second memory bank and the data transmission lines based on a second enable signal; and
   an input/output driver controller configured to generate the first and second enable signals based on the shared repair signal and an operation signal.

2. The memory apparatus according to claim 1, wherein the row decoder and repair circuit generates the shared repair signal to a first level when a word line disposed in the first memory bank is not replaced with a word line disposed in the second memory bank, and generates the shared repair signal to a second level when a word line disposed in the first memory bank is replaced with a word line disposed in the second memory bank.

3. The memory apparatus according to claim 2, wherein the input/output driver controller enables the first enable signal when the shared repair signal is the first level and the operation signal is enabled.

4. The memory apparatus according to claim 2, wherein the input/output driver controller enables the second enable signal when the shared repair signal is the second level and the operation signal is enabled.

5. The memory apparatus according claim 2, wherein the input/output driver controller includes an inverter, and a gate configured to perform an AND operation, wherein
   the inverter is configured to invert the shared repair signal and output a resultant signal to the gate, and
   the gate is configured to receive the output of the inverter and the operation signal and output the first enable signal to the first input/output driver.

6. The memory apparatus according to claim 2, wherein the input/output driver controller includes a gate configured to perform an AND operation, wherein
   the gate is configured receive the shared repair signal and the operation signal and output the second enable signal to the second input/output driver.

7. The memory apparatus according to claim 1, wherein the operation signal comprises a read signal for a read operation of the memory apparatus and a write signal for a write operation of the memory apparatus.

8. A memory apparatus comprising:
   a row decoder and repair circuit configured to generate a shared repair signal according to whether a word line disposed in a normal array of a first memory bank is replaced with a word line disposed in a redundant array of a second memory bank;
   a first input/output driver configured to output data from the first memory bank to data input/output lines, or provide data transmitted through the data input/output lines to the first memory bank, based on a first enable signal;
   a second input/output driver configured to output data from the second memory bank to the data input/output lines, or provide data transmitted through the data input/output lines to the second memory bank, based on a second enable signal; and
   an input/output driver controller configured to generate the first and second enable signals based on the shared repair signal and an operation signal.

9. The memory apparatus according to claim 8, wherein the row decoder and repair circuit generates the shared repair signal to a first level when a word line disposed in the normal array of the first memory bank is not replaced with a word line disposed in the redundant array of the second memory bank, and generates the shared repair signal to a second level when a word line disposed in the normal array of the first memory bank is replaced with a word line disposed in the redundant array of the second memory bank.

10. The memory apparatus according to claim 9, wherein the input/output driver controller enables the first enable signal when the shared repair signal is the first level and the operation signal is enabled.

11. The memory apparatus according to claim 9, wherein the input/output driver controller enables the second enable signal when the shared repair signal is the second level and the operation signal is enabled.

12. The memory apparatus according to claim 9, wherein the input/output driver controller includes an inverter, a first gate configured to perform an AND operation, and a second gate configured to perform an AND operation wherein,
   the inverter is configured to invert the shared repair signal and output a resultant signal to the first gate,
   the first gate is configured to receive the output of the inverter and the operation signal and output the first enable signal, and
   the second gate is configured receive the shared repair signal and the operation signal and output the second enable signal to the second input/output driver.

13. The memory apparatus according to claim 8, wherein the operation signal comprises a read signal for a read operation of the memory apparatus and a write signal for a write operation of the memory apparatus.

14. A method for operating a memory apparatus including first and second memory banks which are disposed adjacent to each other, the method comprising:
   activating simultaneously the first and second memory banks based on a row address signal;
   determining a level of a shared repair signal; and
   performing a read or write operation for one of the first memory bank or the second memory bank based on the shared repair signal and an operation signal.

15. The method according to claim 14, wherein the operation signal comprises a read signal and a write signal.

16. The method according to claim 14, wherein the shared repair signal has different levels according to whether or not a word line disposed in a normal array of the first memory bank is replaced with a word line disposed in a redundant array of the second memory bank.

17. The method according to claim 14, wherein the performing comprises:

enabling a first input/output driver which couples the first memory bank and data input/output lines, when the shared repair signal is a first level and the operation signal is enabled.

18. The method according to claim 17, wherein the performing comprises:
enabling a second input/output driver which couples the second memory bank and the data input/output lines, when the shared repair signal is a second level and the operation signal is enabled.

19. The method according to claim 18, wherein the first and second input/output drivers are enabled by an input/output driver controller configured to receive the shared repair signal and the operation signal and output a first enable signal and a second enable signal based on a state of the shared repair signal and the operation signal.

* * * * *